US007541596B2

(12) United States Patent
He et al.

(10) Patent No.: US 7,541,596 B2
(45) Date of Patent: Jun. 2, 2009

(54) METHOD AND APPARATUS FOR INCREASING LIGHT ABSORPTION IN AN IMAGE SENSOR USING ENERGY CONVERSION LAYER

(75) Inventors: James Xinping He, San Jose, CA (US); Guannho George Tsau, San Jose, CA (US); Ching Hu, Los Altos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 39 days.

(21) Appl. No.: 11/770,496

(22) Filed: Jun. 28, 2007

(65) Prior Publication Data

US 2008/0042066 A1 Feb. 21, 2008

Related U.S. Application Data

(60) Provisional application No. 60/818,946, filed on Jul. 5, 2006.

(51) Int. Cl.
*G01T 1/20* (2006.01)
*H01L 27/146* (2006.01)

(52) U.S. Cl. .................. 250/370.11; 250/370.09; 250/361 R

(58) Field of Classification Search ............ 250/370.09, 250/370.11, 361 R
See application file for complete search history.

(56) References Cited

U.S. PATENT DOCUMENTS 5,786,102 A 7/1998 Paz-Pujalt et al.

| 6,277,301 B1 * | 8/2001 | Hohn et al. ............ 252/301.36 |
| 6,476,867 B1 | 11/2002 | Kobayashi et al. |
| 6,583,419 B1 * | 6/2003 | Moy et al. ............. 250/370.11 |
| 6,783,900 B2 * | 8/2004 | Venkataraman ................ 430/7 |

FOREIGN PATENT DOCUMENTS

| EP | 0 843 363 A1 | 5/1998 |
| JP | 58182267 | 10/1983 |
| JP | 2004/207285 | 7/2004 |
| WO | WO 00/74140 A1 | 12/2000 |

OTHER PUBLICATIONS

Sivakumar, S. et al., "Red, Green, and Blue Light Through Cooperative Up-Conversion in Sol-Gel Thin Films Made with $Yb_{0.80}La_{0.05}F_3$ Nanoparticles," Journal of Display Technology, vol. 3, No. 2, Jun. 2007, pp. 176-183.

European Search Report, Oct. 30, 2007, Omnivision Technologies, Inc.

* cited by examiner

*Primary Examiner*—David P Porta
*Assistant Examiner*—Mindy Vu
(74) *Attorney, Agent, or Firm*—Blakely Sokoloff Taylor & Zafman LLP

(57) ABSTRACT

A system and method for applying a layer of material in the image sensor fabrication process in order to increase the absorption of specific range light spectrum by the image sensor is described. The mechanism adopted is by converting light rays from higher energy range (shorter wavelength) to lower energy range (longer wavelength) such that the light absorption by the image sensor can be increased.

19 Claims, 4 Drawing Sheets

METHOD AND APPARATUS FOR INCREASING LIGHT ABSORPTION IN AN IMAGE SENSOR USING ENERGY CONVERSION LAYER

REFERENCE TO PRIOR APPLICATIONS

This application claims the benefit to U.S. Provisional Application No. 60/818,946 filed, Jul. 5, 2006.

TECHNICAL FIELD

This disclosure relates generally to image sensors, and in particular but not exclusively, relates to image sensors with increased light absorption efficiency.

BACKGROUND INFORMATION

In the current art, image sensors lack efficiency in absorbing light having higher energy wavelengths. For example, light with red wavelengths is more efficiently absorbed than light having blue wavelengths.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a method and apparatus for increasing light absorption in an image sensor using an energy conversion layer are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In general a system and method are disclosed herein for applying a layer of material (an energy conversion layer) in the image sensor fabrication process in order to increase the absorption of a specific range of the light spectrum by the image sensor. The energy conversion layer converts light rays from higher energy ranges (shorter wavelength) to lower energy ranges (longer wavelength) such that the light absorption by the image sensor can be increased. Some examples of energy conversion layers are YAG:Ce crystals or a crystalline cesium iodide scintillator or a rare-earth scintillator (e.g., terbium-doped gadolinium dioxide sulfide).

In some embodiments of the invention, the energy conversion layer may be composed of material that converts X-ray radiation into visible light. In other embodiments of the invention, the energy conversion layer may be composed of material that converts blue light to red light, and/or blue light to yellow light, and/or blue light to green light.

In one embodiment of the invention, the energy conversion layer is used with a color filter to increase the absorption of a specific range of the light spectrum. The energy conversion layer may be masked and deposited such that only filtered light of short wavelengths passes through the energy conversion layer, and filtered light of long wavelengths does not pass through the energy conversion layer.

In another embodiment of the invention, the image sensor may be assembled with an energy conversion layer and without a color filter. This embodiment may be used in detecting images from monochromatic light sources.

Figure 1:
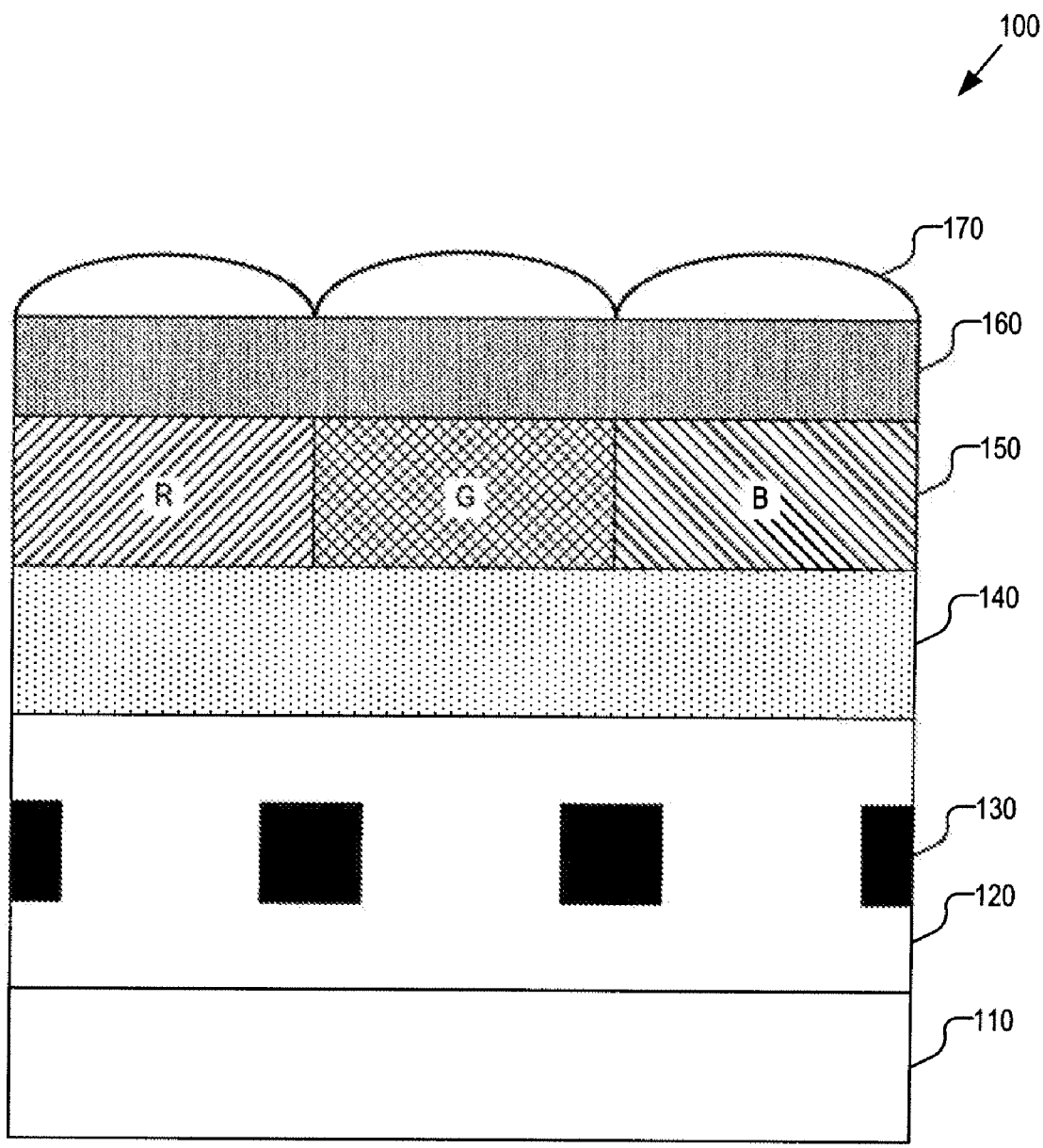
FIG. 1 is a cross-sectional view of a portion of a prior art CMOS image sensor with an RGB color filter.

FIG. 1 is a cross-sectional view of a portion of a prior art CMOS image sensor 100 with an RGB color filter layer 150. Three adjacent pixels are shown to illustrate a red (R), a green (G), and a blue (B) pixels formed in a photodiode layer 110. The CMOS image sensor 100 comprises the photodiode layer 110, a passivation layer 120 with embedded metal interconnects 130, a planarization layer 140, the RGB color filter layer 150, a spacer layer 160, and micro-lenses 170.

Figure 2:
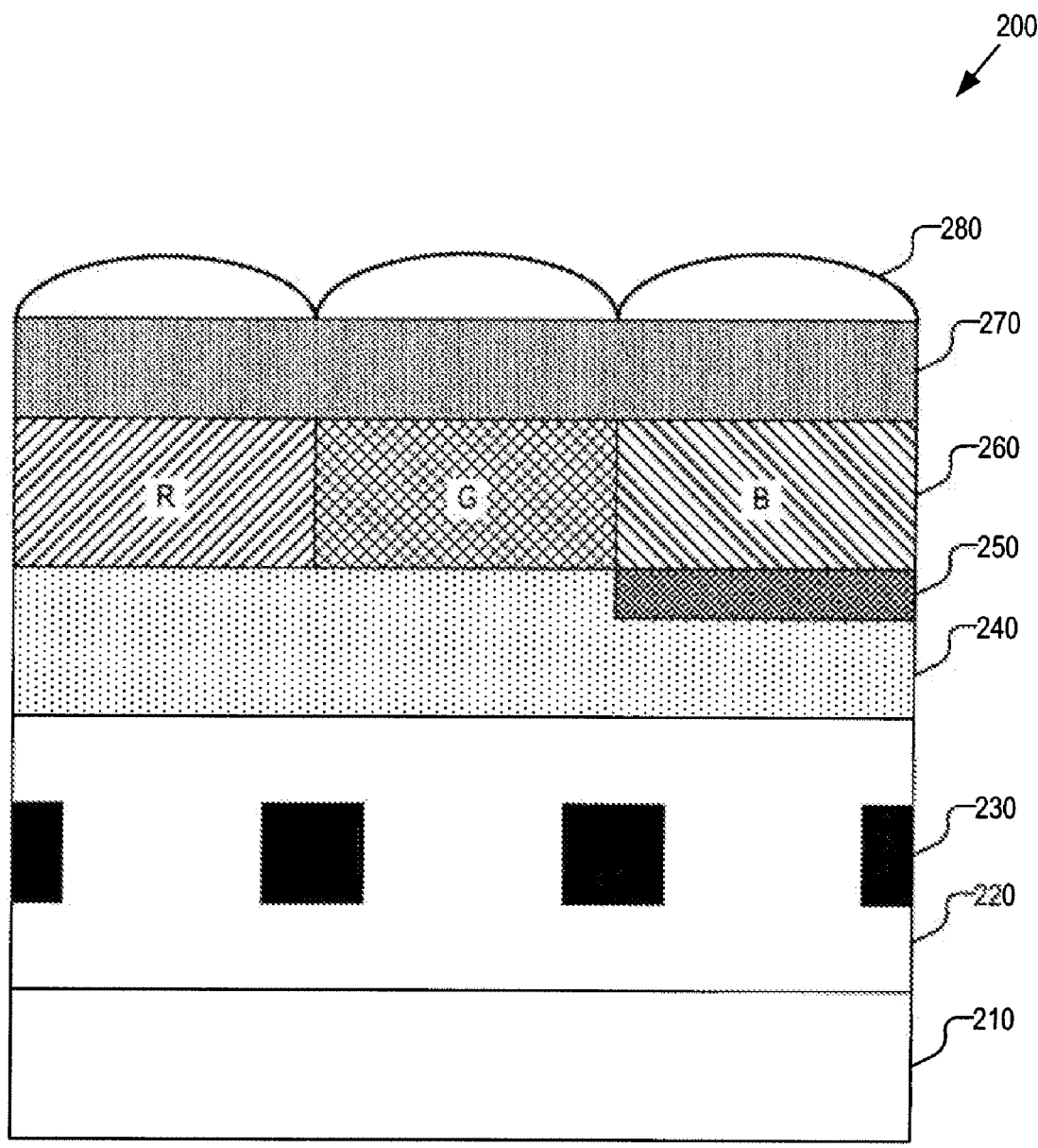
FIG. 2 is a cross-sectional view of a portion of a CMOS image sensor with an energy conversion layer formed underneath a blue section of an RGB color filter layer, in accordance with an embodiment of the invention.

FIG. 2 is a cross-sectional view of a portion of a CMOS image sensor 200 with an energy conversion layer 250 formed underneath a blue section of an RGB color filter layer 260, in accordance with an embodiment of the invention. In other embodiments, the energy conversion layer 250 need not be directly under the blue section (B) of the color filter 260, but may be formed further down in the stack, and as one example, may be formed in the passivation layer 220 or just above the photodiode layer 210. Similar to the prior art of FIG. 1, the CMOS image sensor 200 comprises the photodiode layer 210, the passivation layer 220 with embedded metal interconnect structures 230, a planarization layer 240, RGB color filter layer 260, spacer layer 270, and micro-lenses 280. This embodiment of the present invention further adds the energy conversion layer 250.

The energy conversion layer 250 is operative in this embodiment to convert the incident light passing through the blue filter (B) into light having a wavelength more readily sensed by the underlying photodiode in the photodiode layer 210. Typically, the visible light passing through the blue filter (B) would be at the blue wavelengths. These wavelengths are typically more difficult to detect by conventional photodiodes that are also used to detect red and green wavelengths. The energy conversion layer 250 in one embodiment could be a material that can convert blue wavelength light into red and/or yellow and/or green wavelength light.

Figure 3:
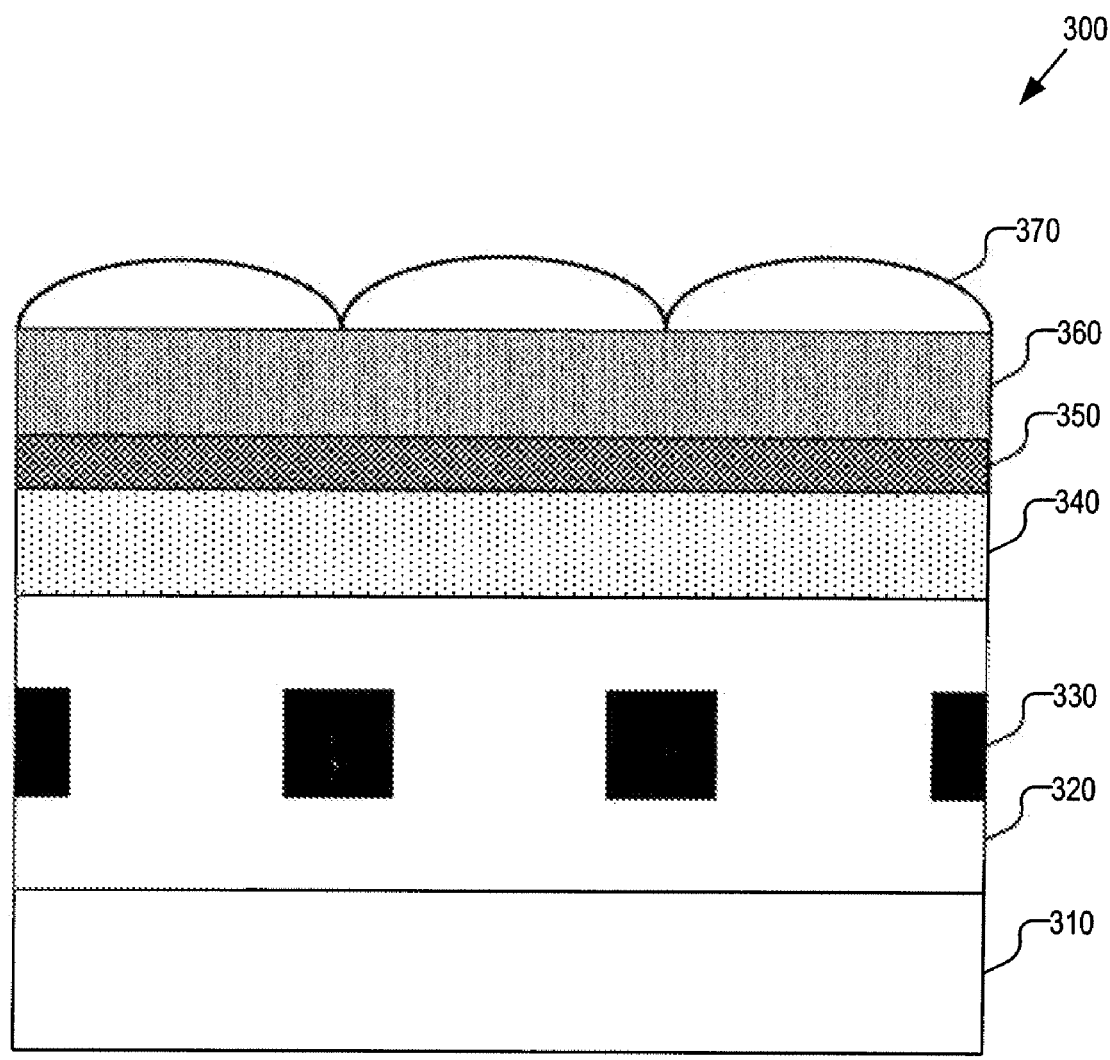
FIG. 3 is a cross-sectional view of a portion of a CMOS image sensor with an energy conversion layer formed between a spacer layer and a planarization layer, in accordance with an embodiment of the invention.

FIG. 3 is a cross-sectional view of a portion of a CMOS image sensor 300 with an energy conversion layer 350 formed between a spacer layer 360 and a planarization layer 340, in accordance with an embodiment of the invention. The CMOS image sensor 300 comprises a photodiode layer 310, a passivation layer 320 with embedded metal interconnects 330, the planarization layer 340, the energy conversion layer 350, the spacer layer 360, and micro-lenses 370. Note that in this embodiment, a color filter layer is not present. Thus, the image sensor 300 is adapted for "black and white" (gray scale) imaging. Note that in other embodiments, the energy conversion layer 350 may be placed literally anywhere in the stack of layers above the photodiode layer 310. Indeed, the energy conversion layer 350 may even be deposited over the micro lens layer 370 or perhaps even above other structures in the image sensor.

The energy conversion layer 350 may be, for example, a layer that can convert incident x-rays into light wavelengths that can be easily detected by the photodiodes in the photodiode layer 310. An image sensor formed in accordance with FIG. 3 can then be used to image medical x-rays easily.

Figure 4:
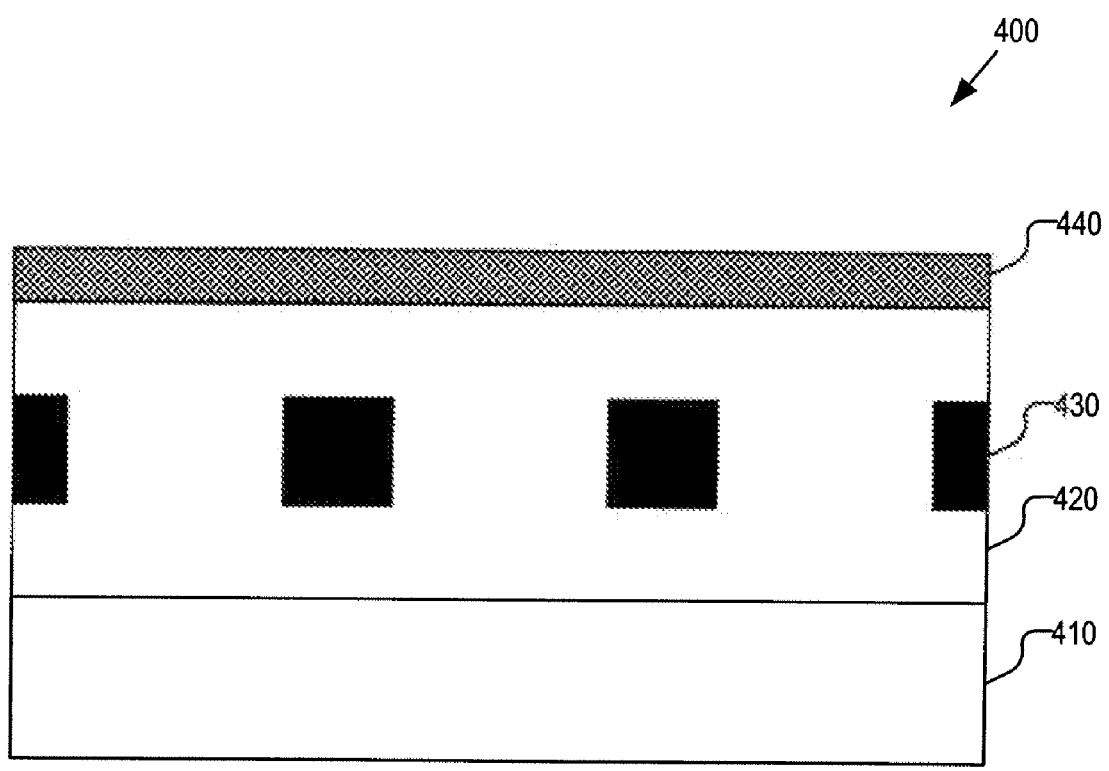
FIG. 4 is a cross-sectional view of a portion of a CMOS image sensor with an energy conversion layer formed on top of a passivation layer, in accordance with an embodiment of the invention.

FIG. 4 illustrates in cross-section a portion of a CMOS image sensor 400 with an energy conversion layer 440 placed on top of a passivation layer 420. The CMOS image sensor 400 comprises a photodiode layer 410, a passivation layer 420 with embedded metal interconnects 430, and an energy conversion layer 440. In other embodiments, the energy conversion layer 440 may be formed further down in the stack, and as one example, may be formed in the passivation layer 420 or just above the photodiode layer 410.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method, comprising:
    passing electromagnetic radiation having a first wavelength range through a color filter of a Complementary Metal Oxide Semiconductor (CMOS) image sensor;
    receiving the electromagnetic radiation having the first wavelength range at an energy conversion layer of the CMOS image sensor, wherein the energy conversion layer is disposed directly adjacent to the color filter;
    converting the electromagnetic radiation into electromagnetic radiation having a second wavelength range;
    directing the electromagnetic radiation having the second wavelength range from the energy conversion layer through a passivation layer;
    sensing the electromagnetic radiation having the second wavelength range at a photodiode layer; and
    routing an electrical signal via an interconnect structure formed within the passivation layer.

2. The method of claim 1, wherein passing the electromagnetic radiation comprises:
    receiving electromagnetic radiation having a plurality of wavelength ranges; and
    filtering the electromagnetic radiation having the plurality of wavelength ranges to allow light of substantially one of the plurality of wavelength ranges to pass through the color filter; and
    directing the electromagnetic radiation having the one of the plurality of wavelength ranges from the color filter to the energy conversion layer.

3. The method of claim 1, wherein the interconnect structure comprises a plurality of metal interconnects and the photodiode layer comprises a plurality of photodiodes, the method further comprising focusing the electromagnetic radiation having a first wavelength range such that the electromagnetic radiation of the second wavelength range traverses through the passivation layer between the plurality of metal interconnects to the plurality of photodiodes.

4. A CMOS image sensor, comprising:
    a color filter layer to receive light, wherein the color filter layer includes a first and a second color filter, the first color filter to allow light of substantially only a first color to pass through the first color filter;
    an energy conversion layer disposed directly adjacent to the first color filter to receive the light of the first color and to convert the light of the first color into light of a second color;
    a passivation layer, having at least one metal interconnect formed therein; and
    a photodiode layer disposed to receive the light of the second color and to detect the received light of the second color, wherein the energy conversion layer and the passivation layer are disposed between the color filter layer and the photodiode layer.

5. The CMOS image sensor of claim 4, wherein the first color filter is a blue filter and the first color is blue, the blue filter to allow light of substantially only the blue color to pass through the blue filter.

6. The CMOS image sensor of claim 4, wherein the photodiode layer comprises a first and a second photodiode, the first color filter to allow light of substantially only the first color to pass through the first color filter to the first photodiode and the second color filter to allow light of substantially only a third color to pass through the second color filter to the second photodiode, wherein the energy conversion layer is located substantially only between the first color filter and the first photodiode and the energy conversion layer is not substantially located between the second color filter and the second photodiode.

7. The CMOS image sensor of claim 4, wherein the photodiode layer comprises a plurality of photodiodes and wherein the passivation layer comprises a plurality of metal interconnects, wherein the photodiodes and the metal interconnects are positioned such that the light having the second color traverses through the passivation layer between the plurality of metal interconnects to at least one of the plurality of photodiodes.

8. The CMOS image sensor of claim 4, further comprising a planarization layer formed between the color filter layer and the passivation layer, wherein the energy conversion layer is formed within the planarization layer.

9. The CMOS image sensor of claim 4, wherein the energy conversion layer comprises a terbium-doped gadolinium dioxide sulfide.

10. The CMOS image sensor of claim 4, wherein the energy conversion layer is to convert light of substantially a blue color into light of a color selected from the group consisting of: red, yellow and green.

11. The apparatus of claim 6, wherein the at least one metal interconnect includes a first metal interconnect and a second metal interconnect, wherein a width of the energy conversion layer is greater than a distance between the first metal interconnect and the second metal interconnect.

12. A Complementary Metal Oxide Semiconductor (CMOS) image sensor, comprising:
- a microlens to receive x-ray radiation having a first wavelength;
- a spacer layer coupled to the microlens;
- a passivation layer having at least one metal interconnect formed therein;
- an energy conversion layer disposed between the spacer layer and the passivation layer to convert the x-ray radiation into electromagnetic radiation having a second wavelength; and
- a photodiode layer to receive and detect the electromagnetic radiation having the second wavelength, wherein the energy conversion layer and the passivation layer are disposed over the same side of the photodiode layer.

13. The CMOS image sensor of claim 12, wherein the passivation layer is disposed between the energy conversion layer and the photodiode layer.

14. The CMOS image sensor of claim 13, wherein the energy conversion layer is adjoining the passivation layer.

15. The CMOS image sensor of claim 12, wherein the photodiode layer comprises a plurality of photodiodes and wherein the passivation layer comprises a plurality of metal interconnects, wherein the photodiodes and the metal interconnects are positioned such that electromagnetic radiation traverses through the passivation layer between the plurality of metal interconnects to the plurality of photodiodes.

16. The CMOS image sensor of claim 12, wherein the energy conversion layer is configured to convert the x-ray radiation into visible light.

17. The CMOS image sensor of claim 12, wherein the first wavelength is shorter than the second wavelength.

18. The CMOS image sensor of claim 12, wherein the energy conversion layer comprises a YAG:Ce crystal.

19. The CMOS image sensor of claim 12, wherein the energy conversion layer comprises a crystalline cesium iodide scintillator.

* * * * *